(12) United States Patent
Lim et al.

(10) Patent No.: US 6,425,439 B1
(45) Date of Patent: Jul. 30, 2002

(54) COOLING DEVICE WITH MICRO COOLING FIN

(75) Inventors: Geunbae Lim, Suwon; Hayong Yun, Yongin; Jung Hyun Lee, Kwacheon; Yukeun Eugene Pak, Seongnam; Jung-sang Ko, Suwon; Sung-jin Kim, Tae-jeon, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/029,702

(22) Filed: Dec. 31, 2001

Related U.S. Application Data

(63) Continuation of application No. 09/702,859, filed on Nov. 1, 2000, now Pat. No. 6,334,480.

(30) Foreign Application Priority Data

Nov. 9, 1999 (KR) ............................................ 99-49418

(51) Int. Cl.$^7$ .................................................. F28F 7/00
(52) U.S. Cl. ................... 165/80.3; 165/109.1; 29/890.3
(58) Field of Search ............................... 165/80.3, 185, 165/109.1; 29/890.03

(56) References Cited

U.S. PATENT DOCUMENTS

| | | | |
|---|---|---|---|
| 5,008,582 A | | 4/1991 | Tanuma et al. |
| 5,532,177 A | * | 7/1996 | Cathey .......................... 437/40 |
| 5,558,156 A | | 9/1996 | Tsutsui |
| 5,940,272 A | | 8/1999 | Emori et al. |
| 6,026,895 A | | 2/2000 | Moresco et al. |
| 6,043,978 A | | 3/2000 | Mody et al. |
| 6,126,276 A | * | 10/2000 | Davis et al. ................... 347/65 |
| 6,128,188 A | * | 10/2000 | Hanners ....................... 361/694 |
| 6,138,748 A | * | 10/2000 | Hamburgen et al. ......... 165/185 |
| 6,218,237 B1 | * | 4/2001 | Sandhu et al. ............... 438/253 |
| 6,236,103 B1 | * | 5/2001 | Bernstein et al. ............ 257/532 |
| 6,323,100 B1 | * | 11/2001 | Kimura ....................... 438/396 |

FOREIGN PATENT DOCUMENTS

| | | |
|---|---|---|
| JP | 03252157 A | 11/1991 |
| JP | 06097336 A | 4/1994 |
| JP | 10122787 A | 5/1998 |
| SU | 1643922 A | 4/1991 |

* cited by examiner

*Primary Examiner*—Henry Bennett
*Assistant Examiner*—Terrell McKinnon
(74) *Attorney, Agent, or Firm*—Burns, Doane, Swecker & Mathis, L.L.P.

(57) ABSTRACT

A cooling device with micro cooling fins is provided. The cooling device includes a substrate, a plurality of vibrating type cooling fins extending from the substrate, and a blast fan for ventilating the substrate to cool the substrate and the vibrating type cooling fins and for causing the vibrating type cooling fins to vibrate. Accordingly, micro cooling fins formed on the surface of a substrate change the flowing path of the air and improve the performance of heat transfer near the surface of the substrate due to their vibration. In other words, the resistance to heat transfer is decreased and the performance of heat transfer is improved by disturbing the formation of a heat boundary layer, which is formed on a smooth surface. Since the cooling device provides improved heat transfer performance compared to an existing cooling device, an area and volume for heat transfer can be decreased so that the cooling device can be miniaturized.

4 Claims, 7 Drawing Sheets

COOLING DEVICE WITH MICRO COOLING FIN

This application is a continuation of U.S. application Ser. No. 09/702,859, filed on Nov. 1, 2000 now U.S. Pat. No. 6,334,480.

BACKGROUND OF THE INVENTION

1. Field of the Invention

The present invention relates to a cooling device having a micro cooling fin, and more particularly, to a cooling device having a micro cooling fin employing a Micro ElectroMechanical System (MEMS).

2. Description of the Related Art

In conventional cooling devices for electronic equipment and parts, a plurality of cooling fins are installed in a single base, and a blast fan for forcibly inducing the flow of the air when necessary is integrated into a cooling device. For example, a heat releasing device for cooling the CPU of a computer includes a plurality of cooling fins 2 on a single base 1 and a cooling fan 3 for generating an air flow with respect to the cooling fins 2, as shown in FIG. 1. Such a cooling device employing a forced air flow method forcibly makes the air surrounding fins flow to release heat from the cooling fins, as shown in FIG. 2.

However, in such a conventional cooling device, cooling fins are fixed, and their surfaces are smooth, so a significantly thick heat boundary layer 4 is spontaneously formed on a cooling fin when the air flows along the smooth surface of the cooling fin, as shown in FIG. 3. As a result, heat cannot be effectively released from the cooling fin 2. This is because an air space 5 accumulated in a heat boundary layer serves to resist heat transfer so as to inhibit heat from being released from the surface of the cooling fin 2. Thermal resistance within the accumulated air space 5 increases as distance from the surface of the cooling fin 2 decreases. The air space 5 is motionless on the surface of the cooling fin 2, so only heat transfer due to diffusion effects occurs, and there is not convection. As shown in FIG. 3, the air is forcibly made to flow toward the cooling fin 2 by the blast fan 3 at a speed of $V_0$. In a portion distance from the accumulated heat boundary layer 4 on the cooling fin 2, the air flows at a speed of about $V_0$, but the air flows at a speed of about $V_1$ which is less than $V_0$ when it passes through the heat boundary layer 4. The air flows at a speed of $V_2$ which is less than $V_1$ in the underlying accumulated air space 5. The flow of the air actually halts on the surface of the cooling fin 2. The halt of the air flow is due to friction and viscous force working between the air and the cooling fin 2, in view of aerodynamics. Accordingly, a large cooling fin is required to release a large amount of heat. However, as the size of a cooling fin increases, the surface area of the cooling fin and thermal resistance increase. So, the size of a cooling device is larger, and a heat transfer rate per unit volume decreases. This goes against the trend of miniaturizing parts, for example, the parts of a computer.

SUMMARY OF THE INVENTION

To solve the above problems, it is a first object of the present invention to provide a cooling device with a micro cooling fin having an efficient heat releasing structure.

It is a second object of the present invention to provide a cooling device with its a micro cooling fin, which has a high efficiency of heat release and a small size.

Accordingly, to achieve the above objects of the invention, in one embodiment, there is provided a cooling device with a micro cooling fin. The cooling device includes a substrate, and a plurality of vibrating type cooling fins extending from the substrate.

In another embodiment, there is provided a cooling device with a micro cooling fin, including a substrate, a plurality of vibrating type cooling fins extending from the substrate, and a blast fan for ventilating the substrate to cool the substrate and the vibrating type cooling fins and for causing the vibrating type cooling fins to vibrate.

In a cooling device according to the present invention, the substrate is preferably a semiconductor substrate. It is preferable that each of the vibrating type cooling fins extends in parallel to the surface of the substrate, and a hollow portion is provided below each vibrating type cooling fin.

Meanwhile, it is preferable to install the blast fan such that the air can be sent to the substrate at a predetermined angle with respect to the level of the substrate.

It is preferable to allow each of the vibrating type cooling fins to have a resonance frequency corresponding to a flow rate given by the blast fan so that the vibrating type cooling fins resonate in response to the flowing air generated by the blast fan.

It is preferable to form a coating layer for giving stress to the surface of each of the vibrating type cooling fins on the surface of the vibrating type cooling fins.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Figure 1:
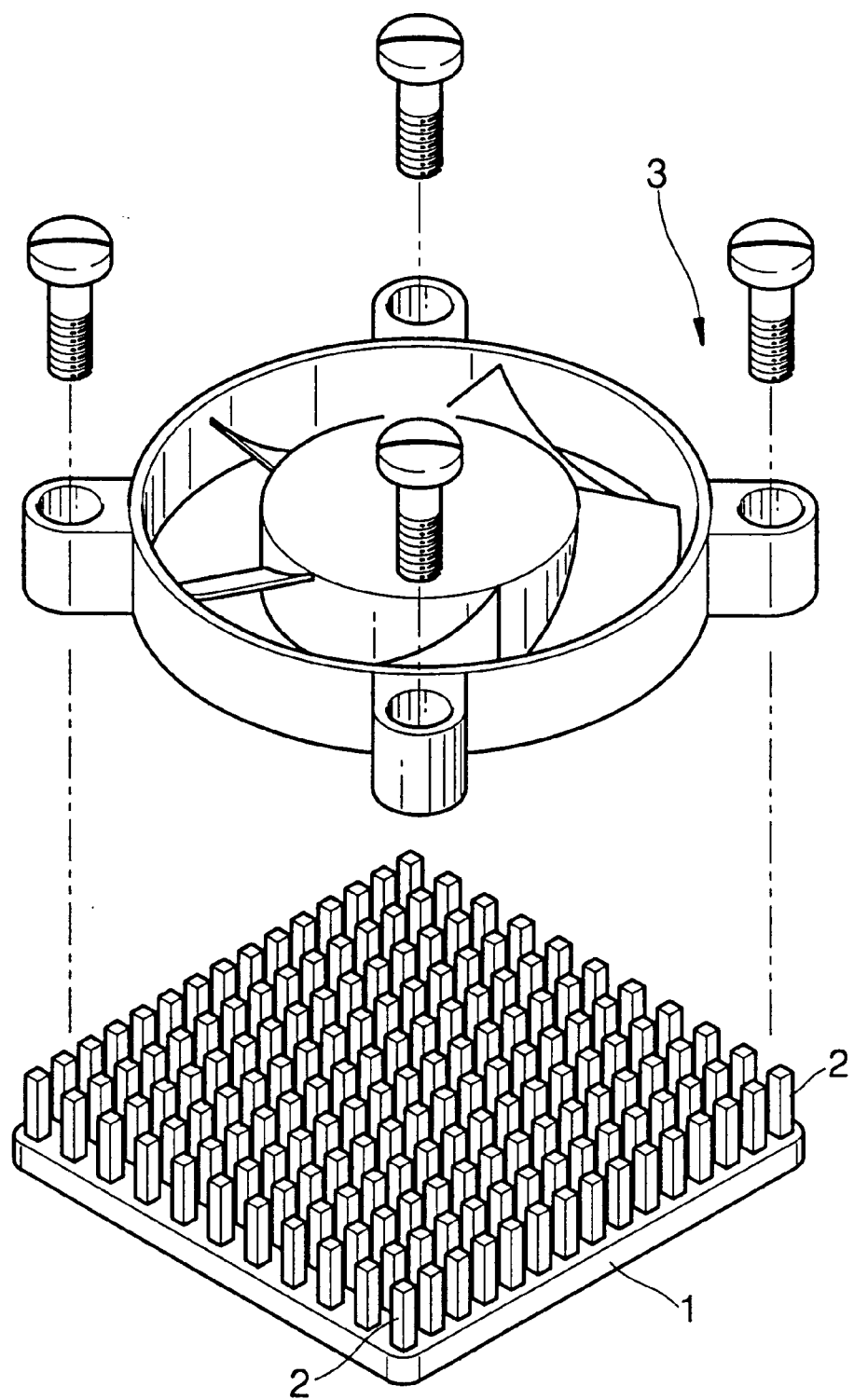
FIG. 1 is a perspective view illustrating an example of a conventional cooling device.
Figure 2:
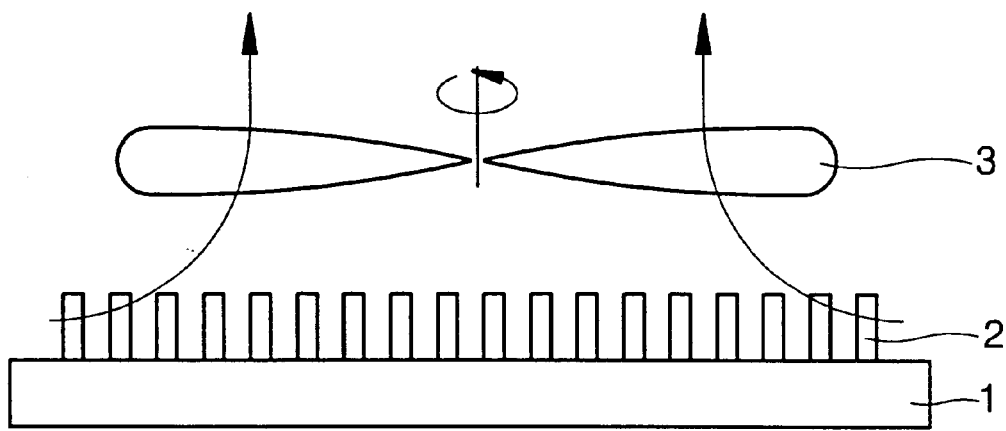
FIG. 2 is a side view illustrating the flow of air in the cooling device of FIG. 1.
Figure 3:
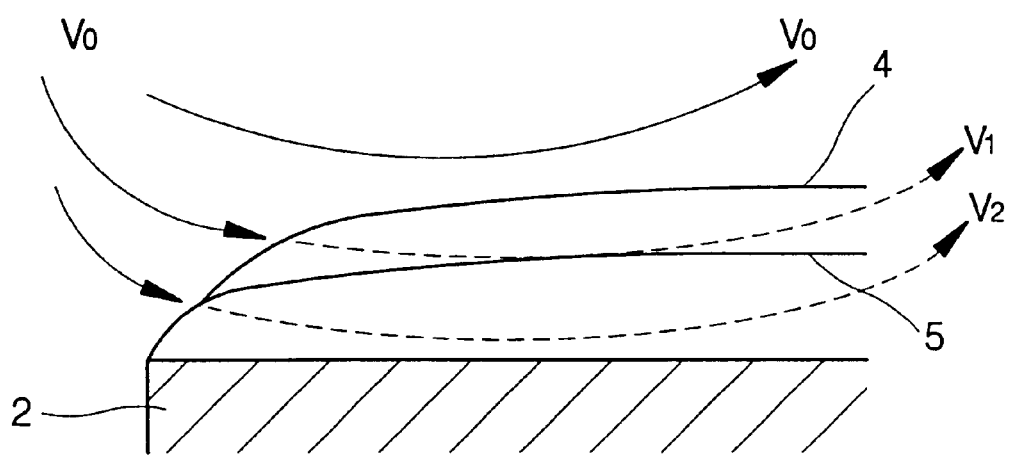
FIG. 3 is a view illustrating a structure in which a heat boundary layer and accumulated air space are formed around a cooling fin depending on the flow of air.
Figure 4:
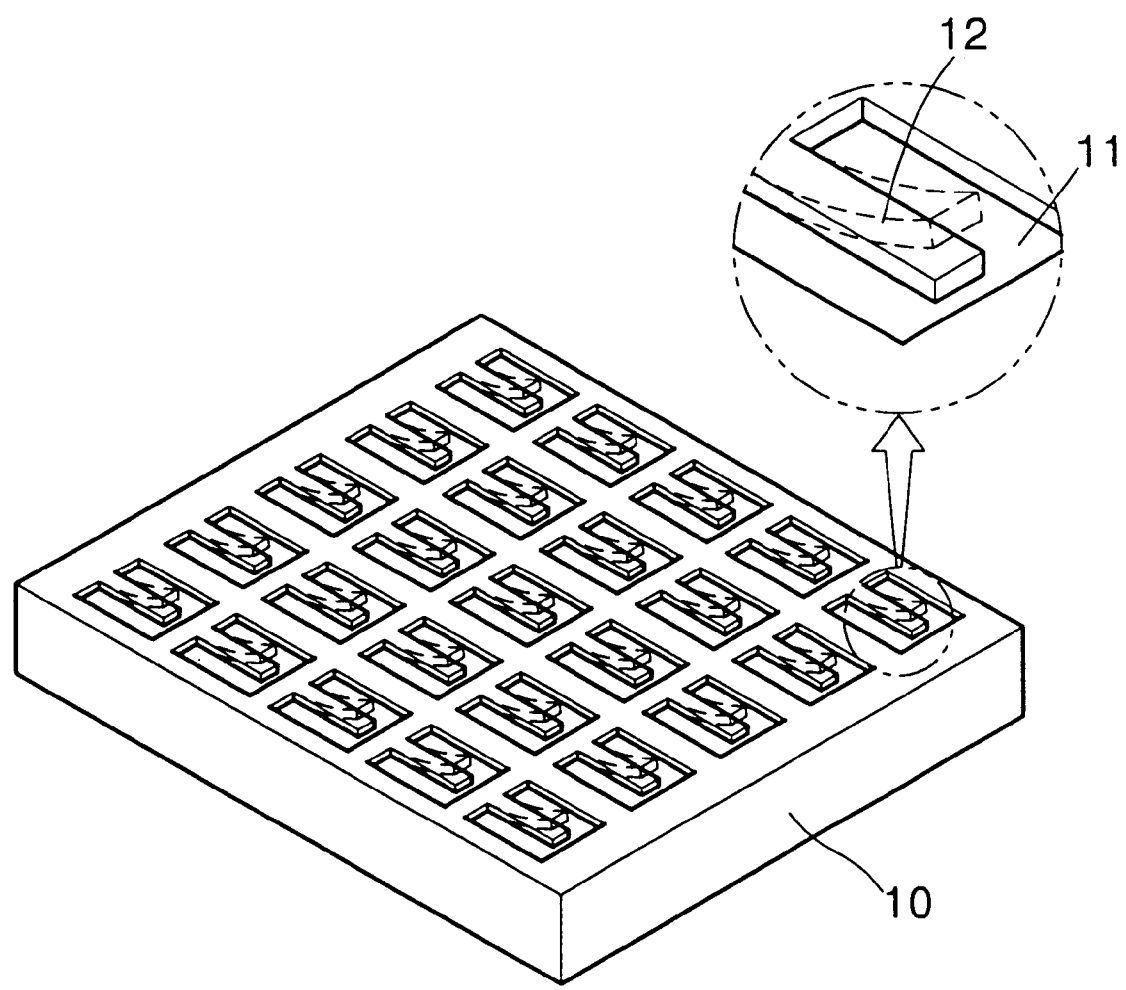
FIG. 4 is a perspective view illustrating the structure of a cooling device according to a first embodiment of the present invention.

Referring to FIG. 4, a plurality of grooves 11 having a predetermined depth are formed on a substrate 10. A cooling fin 12 of a cantilever type is formed in the opening portion of each of the grooves 11 such that it extends from the edge of the opening portion of the groove 11.

The substrate 10 is a semiconductor substrate and is integrated with the cooling fin 12. Here, in order to allow the cooling fin 12 to resist the flow of the air, it is preferable to make the surface of the cooling fin 12 level with the surface of the substrate 10, or to make the extending end of the cooling fin 12 have a predetermined height from the surface of the substrate 10 so that the end of the cooling fin 12 is exposed.

Figure 5:
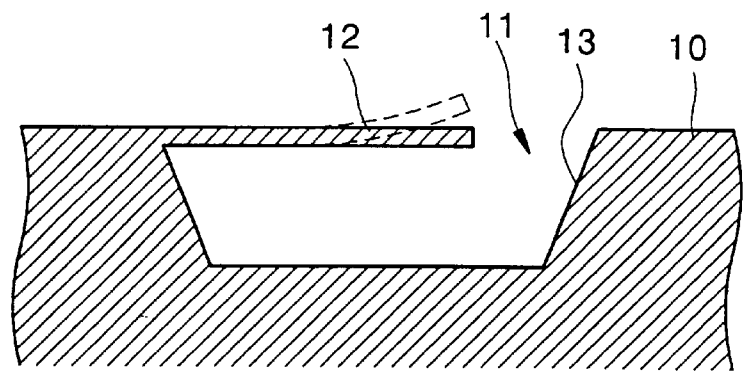
FIG. 5 is a partial sectional view illustrating the structure of a cooling device according to the first embodiment of the present invention.

The cooling fin 12 is formed using a Micro ElectroMechanical System (MEMS) technique. Referring to FIG. 5, the groove 11 has slanted sidewalls 13, and the cooling fin 12 is spaced from the bottom of the groove 11.

A method of forming a cooling fin 12 is as follows.

Figure 6A:
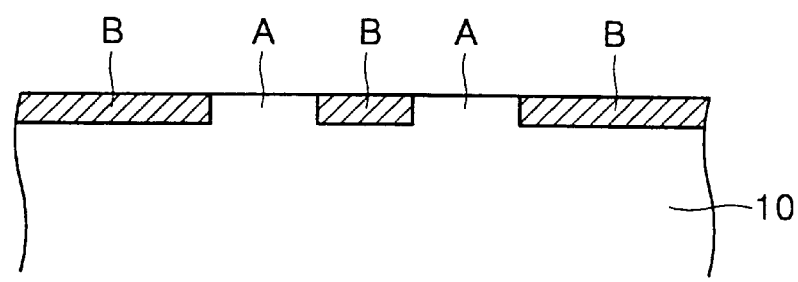
FIGS. 6A through 8 are views illustrating the manufacturing processes of a cooling device according to the present invention.
Figure 6B:
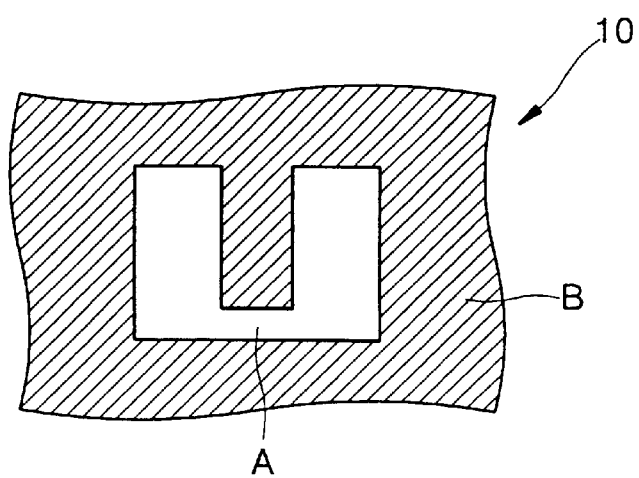

As shown in FIG. 6A, the surface of a substrate 10 formed of a semiconductor wafer is doped with, for example, boron, in a predetermined pattern. In FIGS. 6A and 6B, a reference character B denotes an area doped with boron for preventing or stopping etching, and a reference character A denotes an undoped area.

Figure 7:
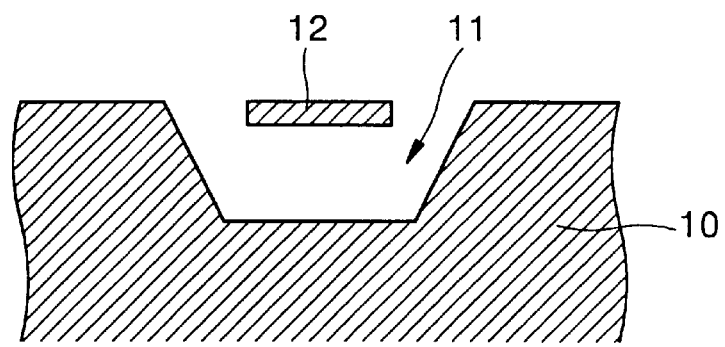

As shown in FIG. 7, an undoped area is etched to a predetermined depth by performing an anisotropic etching process using an etchant having a higher etching rate with respect to the undoped area than with respect to the doped area, thereby forming a groove 11 and a cooling fin 12 disposed at the center of the groove 11.

Figure 8:
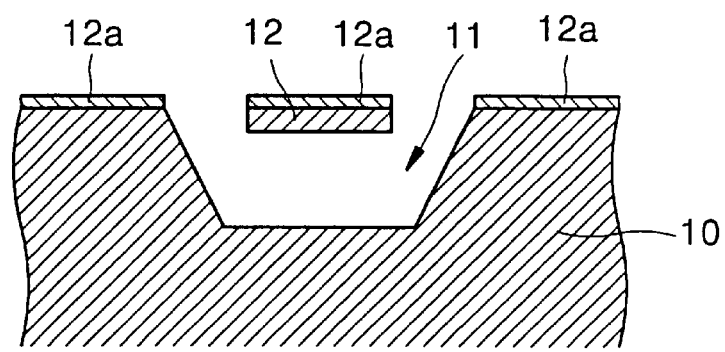

As shown in FIG. 8, a coating layer 12a is formed on the surface of the substrate, in particular, on the surface of the cooling fin 12. The coating layer 12a gives appropriate stress to the cooling fin 12 derived from the semiconductor wafer. thereby preventing the cooling fin 12 from drooping down to the bottom of the groove 11 and, furthermore, curving the cooling fin 12 such that the end of the cooling fin 12 directs upward.

The coating layer 12a may be formed by deposition of special metal or nonmetal or, as described above, a doping or growth method for giving appropriate stress to the cooling fin 12.

Figure 9:
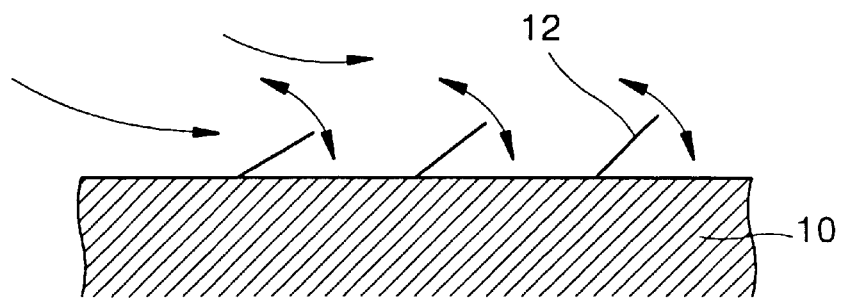
FIG. 9 is a side view illustrating the operating structure of a cooling fin in a cooling device according to the first embodiment of the present invention.

FIG. 9 illustrates a state in which the cooling fin 12 vibrates due to a flow of air into the substrate 10. Here, the vibration of the cooling fin 12 disturbs a boundary layer, i.e., accumulated air space and a heat boundary layer, formed around the cooling fin 12 so that the accumulated air space and the heat boundary layer become much thinner or are broken. Accordingly, heat concentrated on the substrate 10 and the cooling fin 12 is easily exposed to flowing air space so that heat can be effectively released. Here, the cooling fin 12 can be made to vibrate more effectively by adjusting the characteristic frequency of the cooling fin 12 to be suitable for the flow rate of the air.

Figure 10:
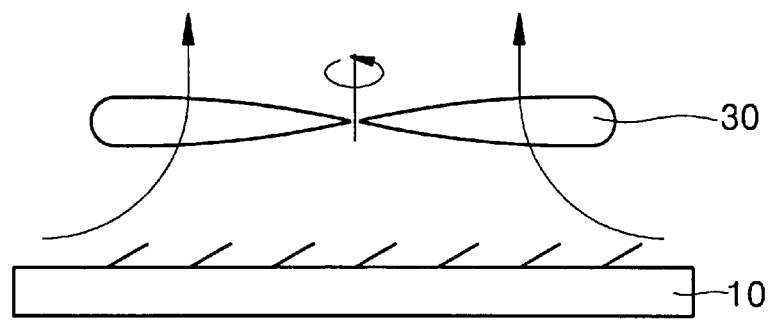
FIG. 10 is a side view illustrating the flow of air in a cooling device according to a second embodiment of the present invention.
Figure 11:
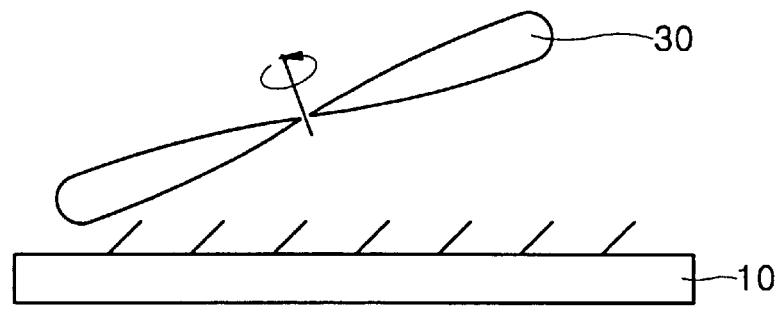
FIG. 11 is a side view illustrating the flow of air in a cooling device according to a third embodiment of the present invention.

FIG. 10 illustrates a state in which a blast fan 30 is disposed to be parallel to the surface of a substrate 10. FIG. 11 illustrates a structure in which a blast fan 30 is disposed to be slanted with respect to the surface of a substrate 10 at a predetermined angle.

In such structures, the substrate 10 may be formed directly on the surface of a heating source, for example, a semiconductor device, or may be formed on the surface of an external mold packaging a semiconductor device.

Figure 12:
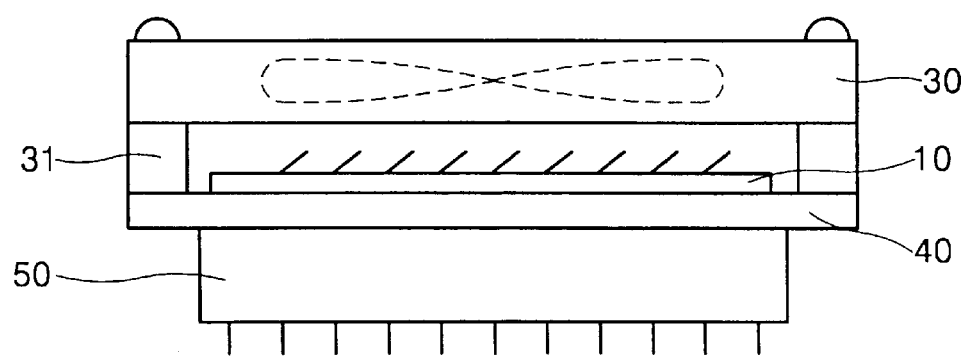
FIG. 12 is a side view illustrating the flow of air in a cooling device according to a fourth embodiment of the present invention.

FIG. 12 illustrates a cooling device prepared for being mounted on a central processing unit (CPU) 50 of a computer, according to an embodiment of the present invention. A substrate 10 is bonded to a base 40 formed of metal such as copper or aluminum which has excellent heat conductivity. A blast fan 30 is disposed above the substrate 10, spaced from the substrate 10 by a predetermined distance by a spacer 31. The base 40 is bonded to the surface of the CPU 50 with a thermohardening silicon adhesive or a separate coupling member.

Figure 13:
FIG. 13 is a photograph of the substrate of a cooling device manufactured using a Micro ElectroMechanical System (MEMS) according to the present invention.

FIG. 13 is a photograph of the substrate of a cooling device manufactured using a MEMS according to the present invention.

According to the present invention, a micro cooling fin formed on the surface of a substrate changes the flowing path of the air and improves the performance of heat transfer near the surface of the substrate due to its vibration. In other words, the present invention decreases the resistance to heat transfer and improves the performance of heat transfer by disturbing the formation of a heat boundary layer, which is formed on a smooth surface. Since a cooling device according to the present invention provides improved heat transfer performance compared to an existing cooling device, an area and volume for heat transfer can be decreased so that the cooling device can be miniaturized.

Although the invention has been described with reference to particular embodiments, it will be apparent to one of ordinary skill in the art that modifications to the described embodiments may be made without departing from the spirit and scope of the invention. Therefore, the scope of the invention will be defined by the appended claims.

What is claimed is:

1. A method of making a micro cooling device comprising the steps of:
    obtaining a substrate with a top surface;
    doping the top surface in a predetermined pattern, such that the predetermined pattern facilitates the forming of cooling fins and grooves,
    etching the undoped surface to a predetermined depth, forming grooves and coating the doped surface with a material that provides tension on a top surface of the cooling fins.

2. A method of making a micro cooling device in accordance with claim 1, wherein the predetermined pattern defines a doped area with a plurality of closed perimeter lines with a predetermined thickness and within each of the plurality of closed perimeter lines is defined at least one of the cooling fins wherein one edge of the at least one cooling fin contacts the respective closed perimeter line.

3. A method of making a micro cooling device in accordance with claim 1, wherein the step of etching is performed with an anisotropic etching process using an etchant having a higher etching rate with respect to the undoped area than with respect to the doped area.

4. A method of making a micro cooling device in accordance with claim 1, wherein the step of coating the doped surface includes deposition of a metal.

* * * * *